United States Patent [19]
Beyer

[11] Patent Number: 5,965,459
[45] Date of Patent: Oct. 12, 1999

[54] METHOD FOR REMOVING CREVICES INDUCED BY CHEMICAL-MECHANICAL POLISHING

[75] Inventor: Klaus Dietrich Beyer, Poughkeepsie, N.Y.

[73] Assignee: International Business Machines Corporation, Armonk, N.Y.

[21] Appl. No.: 08/729,558

[22] Filed: Oct. 11, 1996

[51] Int. Cl.⁶ .............................. H01L 21/00; H01L 21/70
[52] U.S. Cl. .......................... 438/692; 438/693; 438/694; 438/959
[58] Field of Search ..................................... 438/693, 692, 438/959, 694

[56] References Cited

U.S. PATENT DOCUMENTS

| | | | |
|---|---|---|---|
| 5,300,813 | 4/1994 | Joshi et al. ............................... | 257/752 |
| 5,302,233 | 4/1994 | Kim et al. ................................ | 156/636 |
| 5,312,512 | 5/1994 | Allman et al. ........................... | 156/636 |
| 5,403,779 | 4/1995 | Joshi et al. .............................. | 437/190 |
| 5,426,330 | 6/1995 | Joshi et al. .............................. | 257/752 |
| 5,514,245 | 5/1996 | Doan et al. ........................... | 156/636.1 |
| 5,516,729 | 5/1996 | Dawson et al. ......................... | 437/228 |

*Primary Examiner*—D. Margaret M. Mach
*Attorney, Agent, or Firm*—Susan M. Murray; Joseph P. Abate

[57] ABSTRACT

A planarizing method involves a first polishing step in which a relatively hard, low compressibility pad removes excess material of a first layer and planarizes the first layer. Deep defects emanating from the polishing surface formed during the first polishing step are then enlarged and filled with a second layer. After filling, and optionally annealing, the second layer is planarized by polishing with a relatively soft and high compressibility pad or by anisotropic etching.

25 Claims, 4 Drawing Sheets

METHOD FOR REMOVING CREVICES INDUCED BY CHEMICAL-MECHANICAL POLISHING

FIELD OF THE INVENTION

This invention relates in general to semiconductor processing and more specifically to chemical-mechanical polishing of semiconductor substrates.

BACKGROUND OF THE INVENTION

Integrated circuits are formed on a semiconductor substrate by a variety of semiconductor processing methods which provide for a sequence of steps including patterning, additive steps and subtractive steps, in which the integrated circuit structures are formed in a layered manner.

Chemical-mechanical polishing (CMP), sometimes also referred to as chemical-mechanical planarization, is a subtractive method used in semiconductor processing to remove undesired material and provide planar, smooth surfaces on which additional layers may be formed. In general CMP processing involves holding a thin, generally planar, semiconductor substrate (e.g. a wafer) against a rotating polishing surface (e.g. a polishing pad) under controlled pressure. A polishing slurry is supplied to the polishing surface, as a source of abrasive particles and chemical agents for enhancing the polishing process.

Removal of a given material, for instance, a dielectric used to isolate conductors, may be performed in more than one step. For instance, a first polishing step may involve the use of a relatively hard and low compressibility pad to remove the bulk of the undesired dielectric material, followed by a second step which employs a relatively soft pad of high compressibility intended to remove surface defects, such as microscratches, caused by the first polishing step. It is undesirable to have microscratches in the dielectric, because they can be inadvertently filled with conductive materials in subsequent processing steps, which may produce unintended shorts between conductors in the completed circuit.

CMP techniques often form a part of an overall process, sometimes referred to in the art as "damascene", for forming conductors which connect semiconductor devices. The plurality of such conductors along with insulating dielectric, may be referred to as an interconnect structure. Damascene processing involves formation of a dielectric (eg. by deposition) on the substrate, followed by formation of openings in the dielectric and filling of the openings with a conductive material. After each step, CMP is normally used to remove excess material and to planarize the previously filled material.

SUMMARY OF THE INVENTION

The present invention arises from the discovery that conventional methods for planarizing materials used in semiconductor processing, such as dielectrics, result in the formation of undetected defects that extend below the planarized surface which are exacerbated by subsequent processing steps and which can cause the resulting integrated circuits to fail. Such defects are most commonly in the form of deep and narrow crevices which are intoduced by polishing using a relatively hard polishing pad with low compressibility. Such defects are so deep that they are not removed by subsequent "touch-up" polishing with a relatively soft polishing pad having high compressibility.

The method of the present invention includes a method of planarizing a semiconductor substrate including the steps: a) providing a semiconductor wafer including a substrate and a first layer formed thereon; b) planarizing the semiconductor wafer by chemically-mechanically polishing the first layer using a polishing pad of a hard, low compressibility material; c) enlarging defects in the first layer induced by the step of chemically-mechanically polishing using a pad of a hard, low compressibility material; d) forming a second layer for filling the enlarged defects in the first layer; and planarizing the second layer.

The present invention enjoys advantages over the prior art by identifying and correcting defects which were not previously recognized and could not be detected at a stage in the process where they could be economically corrected. Previously, such defects were only manifested by an electrical failure of the completed integrated circuit and contributed to fabrication yields being less than 100%, thus significantly increasing the overall cost of the finished integrated circuit.

BRIEF DESCRIPTION OF THE DRAWINGS

The subject matter which is regarded as the invention is particularly pointed out and distinctly claimed in the concluding portion of the specification. The invention, however, may best be understood by reference to the following detailed description of the preferred embodiments and the accompanying drawings in which:

DESCRIPTION OF THE PREFERRED EMBODIMENT

Applicant has discovered that prior art CMP methods are not effective in providing a planar surface which is free from harmful or otherwise undesired defects. Applicant has discovered that a relatively hard polishing pad can produce defects which are not readily identifiable immediately after polishing. The defects are usually in the form of deep and narrow crevices which extend substantially below the polishing surface, and thus are not completely removed by subsequent polishing with a relatively soft polishing pad.

Detection of defects on a polished surface of a semiconductor substrate is generally accomplished by visual inspection using high magnification microscopes. The entire area of the polished surface of the semiconductor wafer is scanned at approximately 200× magnification. This level of magnification helps to initially locate defects; once the location of a defect is determined, the defect may then be examined further at much greater magnifications. The defects referred to above (e.g. the deep and narrow crevices) are extremely difficult to detect because they are not visible at magnifications as high as 300×, thus their location is not easily determined. Examining the entire surface at magnifications significantly higher than 300× in order to find such defects is not practical because the time that would be required to cover the entire surface makes it extremely cost prohibitive.

Figure 1:
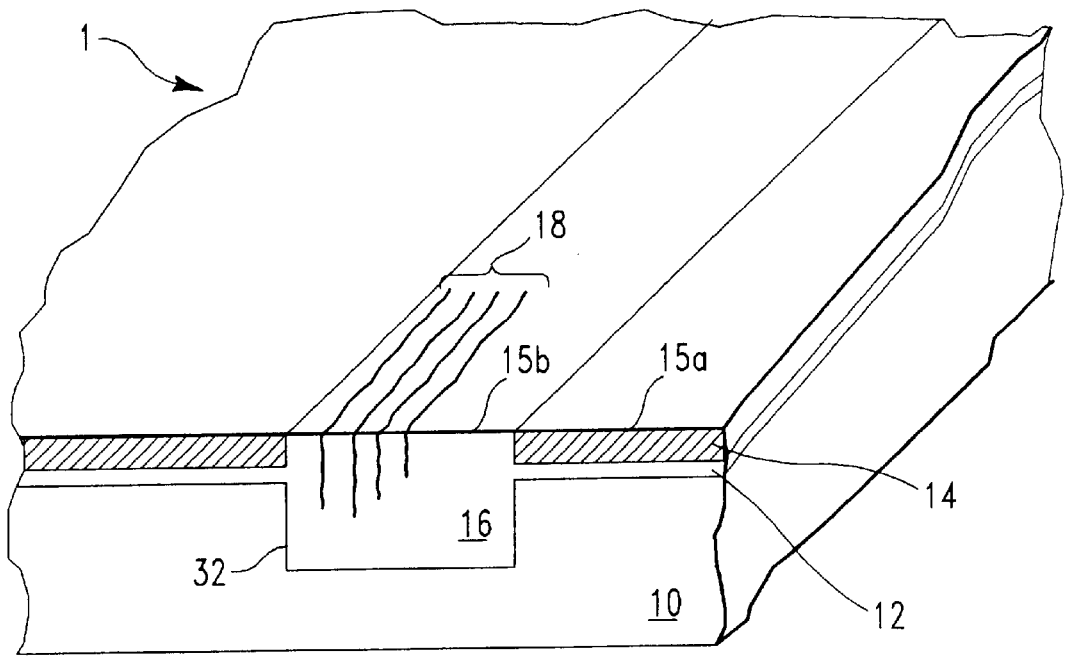
FIG. 1 is a schematic representation of a semiconductor structure in which deep crevices have been induced by chemical-mechanical polishing.

With reference to FIG. 1 (not drawn to scale) there is shown a schematic representation of a semiconductor structure 1 which has been partially processed and which exemplifies the discovered by Applicant. The semiconductor structure 1 of FIG.1 represents a substrate 10 that has been processed according to conventional damascene processing steps. First, a polish stop structure 12/14 which may comprise a silicon nitride layer 14 and a pad oxide layer 12 was formed on the substrate 10. Next, the substrate 10 was patterned and etched, thus defining and forming trench 32. Finally, the shallow trench 32 was filled with a dielectric material 16 followed by polishing to remove excess dielectric and planarize the top surface of the processed substrate 10. FIG. 1 represents the condition of the semiconductor structure 1 after planarization by CMP involving a relatively hard polishing pad with a low compressibility. Excess dielectric 16 has been polished away such that the top surface 15b of the filled trench 32 is approximately level with the top surface 15a of the polish stop structure 12/14. As a result of CMP with the hard pad, deep and narrow crevices 18 are formed. The crevices 18 extend well below the polished top surface 15b of the dielectric 16 in the trench 32 into the body of the filled trench 32 and thus are not removed by subsequent polishing with a relatively soft, high compressibility pad, as has been previously thought in the industry.

Figure 2:
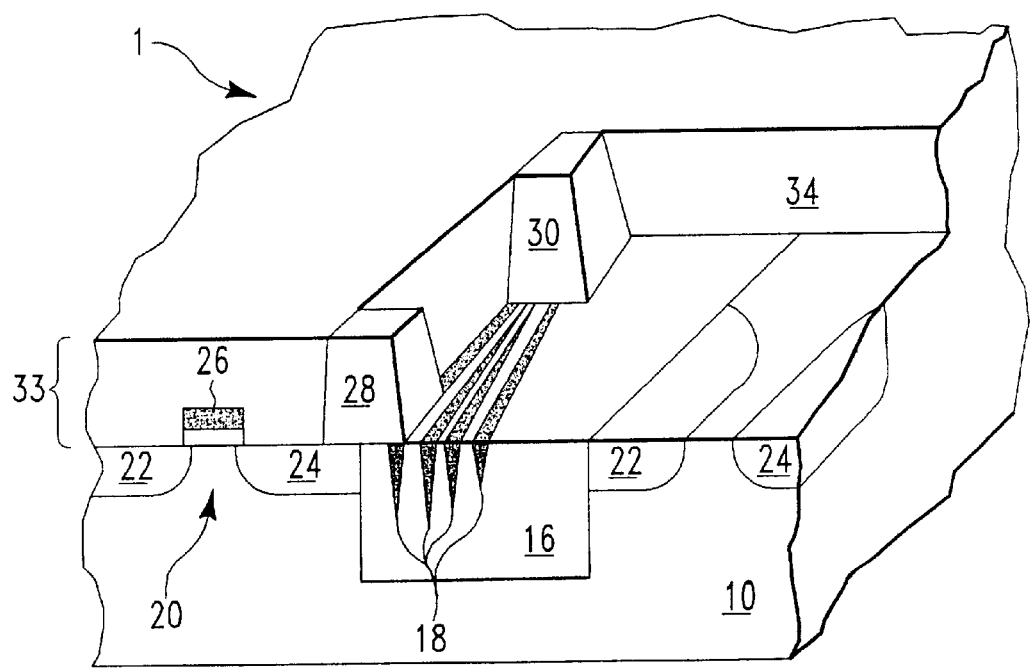
FIG. 2 is a schematic representation of the semiconductor structure of FIG. 1 after further processing in which conductors are unintentionally shorted.

With reference to FIG. 2 (not drawn to scale) there is shown a schematic representation of the structure 1 of FIG. 1 after further processing. Following planarization as described above, the substrate 10 is subjected to various etching and patterning steps to remove the polishing structure (not shown) and to form diffusion regions 22 and 24 and gate 26. The etching step(s) open crevices 18, which are still undetected in the industry. The opened crevices 18 are subsequently unintentionally filled with conductive material. For instance, the opened crevices 18 may be filled with a gate material, for example, polysilicon, during formation of the gate 26, since the gate material may be deposited across the entire substrate prior to patterning with a photosensitive material (not shown). Because the crevices can be quite deep, the conductive material is not completely removed during subsequent processing in which the gate material is removed from unpatterned areas, for example, by a timed etching process. Thus when contacts 28 and 30 of the interconnect structure 33 are formed, they are shorted together by filled crevices 18, thus causing the circuit to fail.

Figure 3:
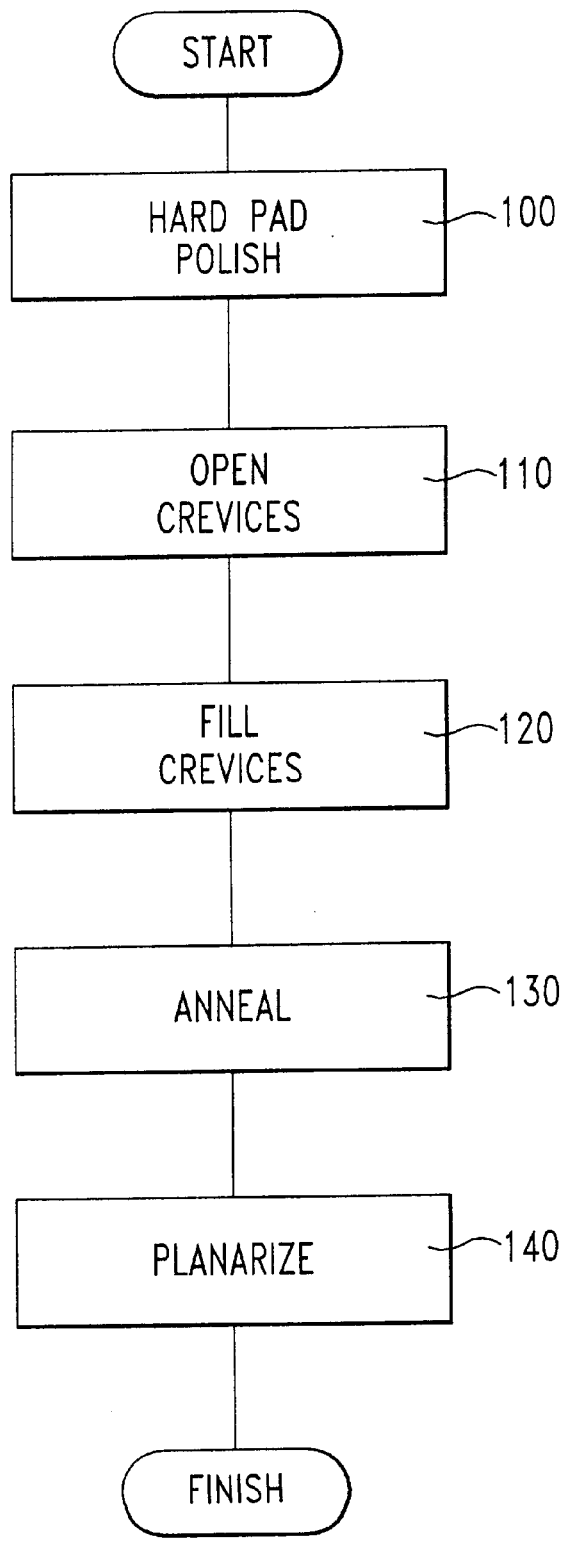
FIG. 3 is a flow chart depicting the steps of a preferred exemplary embodiment of the method of the present invention.
Figure 4A:
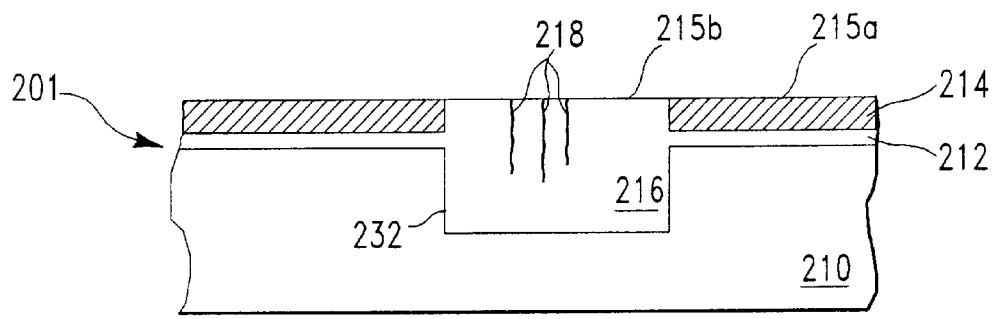
FIGS. 4A–4D are cross-sectional views of a semiconductor structure at various stages of completion of the method shown in FIG. 3.

With reference to FIGS. 3 and 4A–4D a preferred exemplary embodiment of the method of the present invention will now be discussed. FIG. 3 is a flow diagram for an exemplary preferred embodiment of the method of the present invention. FIGS. 4A–4D depict a semiconductor structure 201 at various stages of completion of the method of the present invention. FIG. 4A shows the semiconductor structure 201 after completion of a first chemical-mechanical polishing step 100 (FIG. 3) in which a relatively hard polishing pad having a low compressibility is employed to planarize the substrate 210 following deposition of dielectric 216. For example, dielectric 216 may be formed by known methods, such as, chemical vapor deposition (CVD) of silicon dioxide from Tetra Ethyl Ortho Silicate (TEOS). Polish stop structure 212/214 may comprise a pad oxide layer 212 and a nitride layer 214, and provides a means for detecting when planarization is complete based on thickness measurements (e.g. using optical or other techniques) of the dielectric 216 overlying the nitride layer 214. Layer 214 is preferably resistant to being etched by the etchants used in the polishing slurry. Deep and narrow crevices 218 are created by the hard polishing pad and along and well below the polished surface 215b of dielectric 216. A suitable pad for this step includes the IC1000 pad which is commercially available from Rodel, located in Newark, Del., 19793. Other pads having characteristics similar to that of the IC1000 (e.g. Shore D durometer of approximately 52–62, weight density of approximately 0.630 to 0.850 and compressibility of approximately 0.5 to 6.0%) should also be suitable.

Figure 4B:
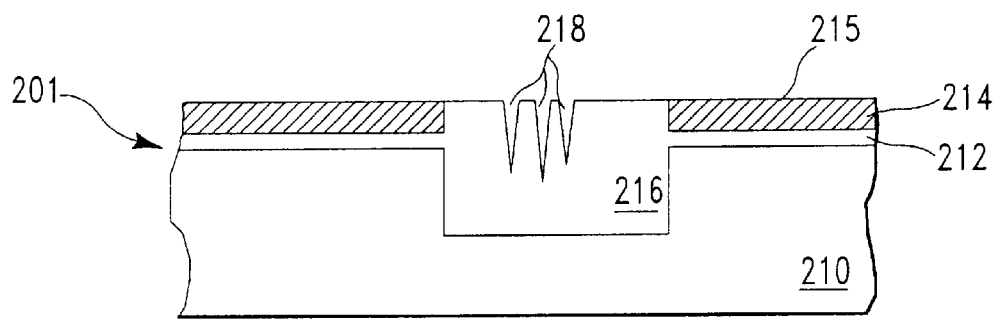

FIG. 4B shows the substrate 210 after completion of a step 110 (FIG. 3) in which the crevices 218 are intentionally enlarged (e.g.opened) so as to provide space for effective filling subsequently. For example, the semiconductor structure 201 can be exposed to an isotropic etch, preferably a chemical wet etch. The etch conditions sufficient to remove a pad oxide of approximately 80 Å should generally be sufficient to open the crevices 218 the desired amount, but the etch conditions will vary according to the material to be etched. For example, if the dielectric material 216 is LPCVD (liquid phase CVD) TEOS $SiO_2$, the etch chemistry may comprise, a solution of 11 parts diluted water to 7 parts 10:1 diluted hydrogen fluoride, for 15 to 100 seconds, and preferably for about 68 seconds. As is known, the etch rate will vary according to the dielectric material 216 (or other material). Other techniques for opening the crevices 218 include plasma etching.

Figure 5:
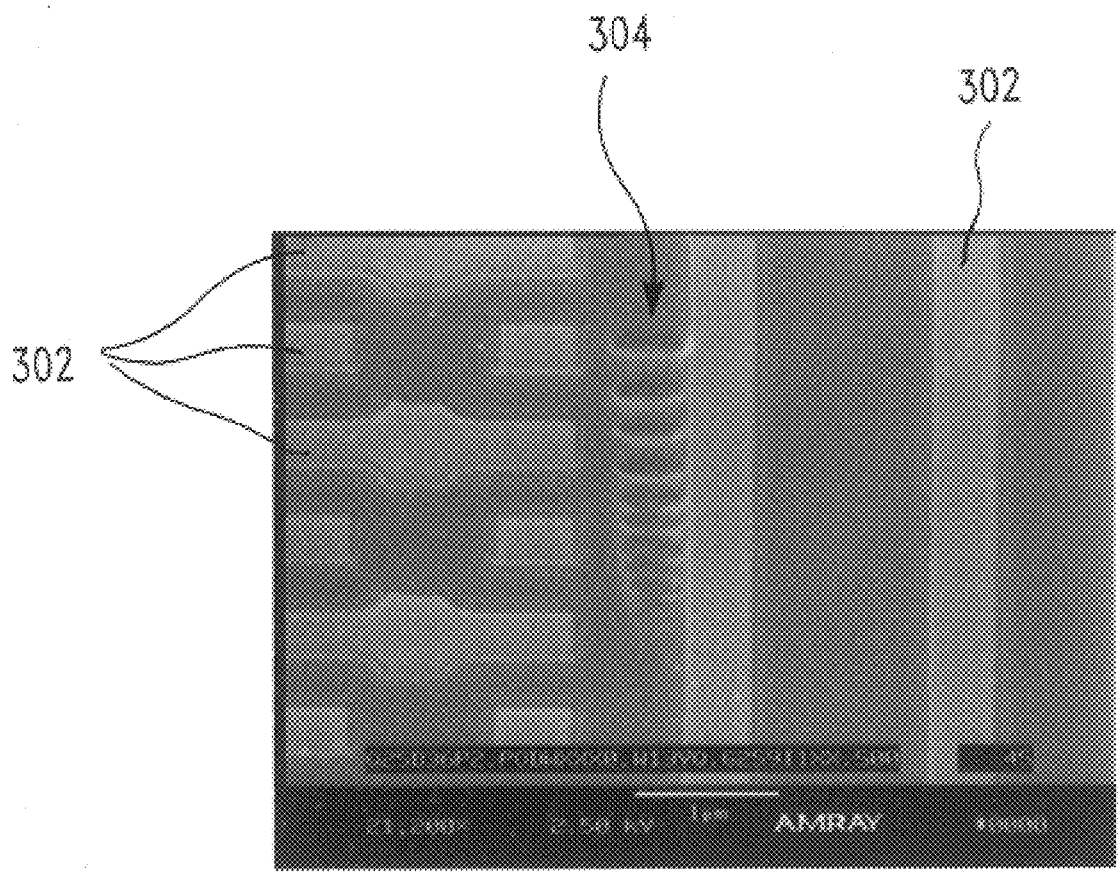
FIG. 5 is a high magnification photograph showing the polished surface of a semiconductor substrate at the stage of completion of the method of the present invention represented by FIG. 4B.

FIG. 5 is a photo at a magnification of 21,200× showing the polished surface of a sample semiconductor substrate at the stage of completion of the method of the present invention represented by FIG. 4B. Shown in the photo are several circuit features 302 as well as several opened crevice defects generally indicated by reference numeral 304. The individual defects shown measure approximately 0.3–0.5 microns by approximately 0.2 microns. At lower defect location magnifications (e.g. approximately 200×–300×), the group of opened crevice defects would appear as a single thin scratch approximately 1.5 microns long, but would not have been visible prior to opening the group of crevices 304. While these dimensions make the crevices extremely difficult to find prior to opening, it is clear that they are large enough to cause the kind of circuit failures described above.

Figure 4C:
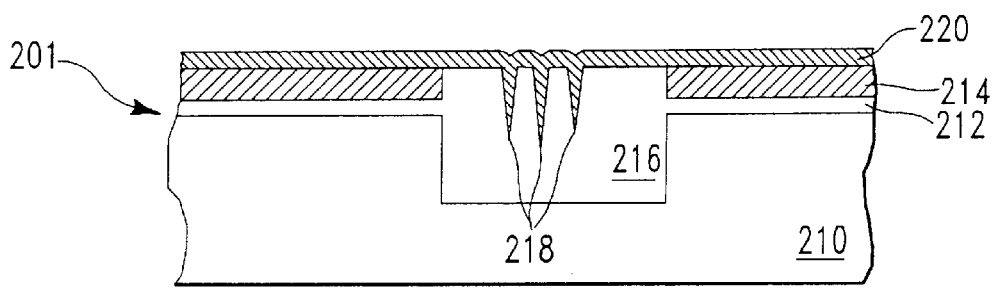

FIG. 4C shows the semiconductor structure 201 after completion of a step 120 (FIG. 3) in which the crevices 218 are filled, for example, by deposition of a layer 220 similar or identical to dielectric 216. For example, layer 220 can be silicon dioxide deposited from TEOS by conventional CVD techniques. Suitable exemplary CVD conditions are 1 Torr pressure at 650° C. using a TEOS flow rate of 43 cc/min. and a nitrogen gas flow rate of 30 cc/min. The layer may be from approximately 200 to 2000 Å thick and is preferably 500 to 1000 Å thick, to afford a large enough volume to completely fill and slightly overfill crevices 218 without making the layer 220 unmanageable for subsequent removal. Other deposition methods, such as spinning methods may also be used. For example, a 1000 Å thick layer of spin-on-glass (SOG) may be formed, followed by a step of annealing at 400° C. for approximately 60 minutes in $N_2$. The layer 220 may be the same dielectric as dielectric material 216 or maybe another dielectric. A different dielectric may be desired for favorable filling properties, for example high density plasma silicon dioxide, phosphosilicate glass (PSG), borophosphosilicate glass (BPSG) or silicon oxynitride. Alternatively, the filling material may be selected according its polishing or etching selectivity, as compared to the material being filled (e.g. dielectric material 216).

After filling the crevices 218, the semiconductor structure 201 is preferably annealed at step 130 (FIG. 3) so as to allow layer 220 to bond to dielectric 216 and to densify the dielectric 216 and layer 220 such that they are less susceptible to attack by wet etching solutions. The anneal may be performed at approximately 900–1100° C. for approximately 5 to 30 minutes, and preferably at approximately 1000° C. for approximately 20 minutes. The anneal is preferably performed under neutral ambient conditions (e.g. characterized by the absence of oxygen) because oxidation of filled trenches can create dislocations.

Figure 4D:
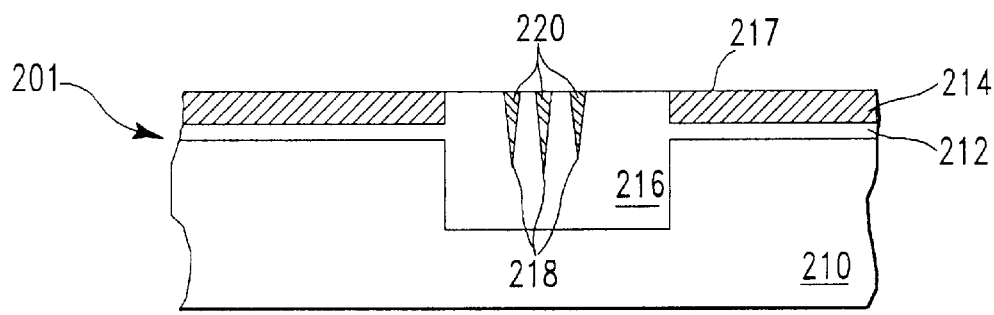

FIG. 4D shows the semiconductor structure 201 after completion of a second planarization step 140 (FIG. 3) to remove excess portions of layer 220 and to planarize the substrate 210, such that crevices 218 are completely filled and surface 217 is flat and smooth. This step is preferably accomplished by polishing as far as the polish stop structure 212/214 using a relatively soft polishing pad. A suitable pad for this step includes the Politex pad commercially available from Rodel. Other pads having characteristics similar to the Politex pad (e.g. a compressibility of approximately 20 to 40%) should also be suitable. Alternatively, an anisotropic etch timed according to the thickness of layer 220, such as a reactive ion etch, can be used to perform this planarization step.

While the invention has been particularly shown and described with reference to preferred embodiments thereof, it will be understood by those skilled in the art that various changes in form and detail may be made therein without departing from the spirit and scope of the invention. More particularly, it should be noted that the invention is not limited to the particular combinations of materials shown in the exemplary embodiment. For example, the material being polished by the method of the present invention may comprise a material other than a dielectric, for instance a metal conductor or a semiconductor which may form part of a semiconductor device or interconnect structure. In light of the foregoing disclosure, a person of ordinary skill in the art would understand how to vary the parameters of the steps of the method of the present invention to achieve the desired result.

I claim:

1. A method of planarizing a semiconductor substrate comprising the steps:

providing a semiconductor wafer including a substrate and a first layer formed thereon;

planarizing the semiconductor wafer by chemically-mechanically polishing the first layer using a polishing pad of a hard, low compressibility material;

enlarging defects in the first layer induced by the step of chemically-mechanically polishing using a pad of a hard, low compressibility material;

forming a second layer including a dielectric material, for filling the enlarged defects in the first layer; and planarizing the second layer.

2. The method as recited in claim 1 wherein the step of planarizing the second layer comprises chemically-mechanically polishing the second layer using a polishing pad of a soft, high compressibility material.

3. The method as recited in claim 1 wherein the step of planarizing the second layer comprises anisotropically etching the second layer.

4. The method as recited in claim 1 wherein an additional step of annealing the semiconductor wafer for a time and at a temperature sufficient to bond and densify the first and second layers is performed prior to the step of planarizing the second layer.

5. The method as recited in claim 2 wherein an additional step of annealing the semiconductor wafer for a time and at a temperature sufficient to bond and densify the first and second layers is performed prior to the step of chemically-mechanically polishing the second layer using polishing pad of a soft, high compressibility material.

6. The method as recited in claim 3 wherein an additional step of annealing the semiconductor wafer for a time and at a temperature sufficient to bond and densify the first and second layers is performed prior to the step of anisotropically etching the second layer.

7. The method as recited in claim 1 wherein the first layer and second layer are each a dielectric material.

8. The method as recited in claim 7 wherein the first layer and second layer are the same dielectric material.

9. The method as recited in claim 4 wherein the first layer and second layer are each a dielectric material.

10. The method as recited in claim 9 wherein the first layer and second layer are the same dielectric material.

11. The method as recited in claim 5 wherein the first layer and second layer are each a dielectric material.

12. The method as recited in claim 11 wherein the first layer and second layer are the same dielectric material.

13. The method as recited in claim 1 wherein the step of enlarging defects comprises isotropically etching the first layer.

14. The method as recited in claim 4 wherein the step of enlarging defects comprises isotropically etching the first layer.

15. The method as recited in claim 5 wherein the step of enlarging defects comprises isotropically etching the first layer.

16. The method as recited in claim 14 wherein the first layer comprises silicon dioxide, the second layer comprises silicon dioxide and the etchant comprises hydrofluoric acid.

17. The method as recited in claim 15 wherein the first layer comprises silicon dioxide, the second layer comprises silicon dioxide and the etchant comprises hydrofluoric acid.

18. A method of planarizing a semiconductor wafer comprising the steps:

providing a semiconductor wafer including a substrate and a first dielectric layer formed thereon;

planarizing the semiconductor wafer by chemically-mechanically polishing the first dielectric layer using a polishing pad of a hard, low compressibility material;

enlarging crevices in the first dielectric layer, the crevices induced by the step of planarizing the semiconductor wafer by chemically-mechanically polishing the first dielectric layer using a polishing pad of a hard, low compressibility material;

forming a second dielectric layer for filling the enlarged crevices in the first dielectric layer; and planarizing the second dielectric layer.

19. The method as recited in claim 18 wherein the step of planarizing the second dielectric layer comprises chemically-mechanically polishing the second dielectric using a polishing pad of a soft, high compressibility material.

20. The method as recited in claim 18 wherein the step of planarizing the second dielectric layer comprises anisotropically etching the second dielectric layer.

21. The method as recited in claim 18 wherein the step of enlarging the crevices comprises isotropically etching the first dielectric layer.

22. The method as recited in claim 18 wherein the first dielectric and second dielectric are the same material.

23. The method as recited in claim 18 wherein an additional step of annealing the semiconductor wafer for a time and at a temperature sufficient to bond and densify the first and second dielectric layers is performed prior to the step of planarizing the second dielectric layer.

24. The method as recited in claim 23 wherein the first dielectric layer and second dielectric layer are the same dielectric.

25. The method as recited in claim 21 wherein the first dielectric layer comprises silicon dioxide, the second dielectric layer comprises silicon dioxide and the etchant comprises hydrofluoric acid.

* * * * *